United States Patent
Engelen et al.

(10) Patent No.: US 9,696,635 B2
(45) Date of Patent: Jul. 4, 2017

(54) METHOD OF CONTROLLING A LITHOGRAPHIC APPARATUS, DEVICE MANUFACTURING METHOD, LITHOGRAPHIC APPARATUS, COMPUTER PROGRAM PRODUCT AND METHOD OF IMPROVING A MATHEMATICAL MODEL OF A LITHOGRAPHIC PROCESS

(75) Inventors: Adrianus Fransiscus Petrus Engelen, Waalre (NL); Henricus Johannes Lambertus Megens, Waalre (NL); Johannes Catharinus Hubertus Mulkens, Valkenswaard (NL); Robert Kazinczi, Helmond (NL); Jen-Shiang Wang, Sunnyvale, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 816 days.

(21) Appl. No.: 13/416,387

(22) Filed: Mar. 9, 2012

(65) Prior Publication Data
US 2012/0229786 A1 Sep. 13, 2012

Related U.S. Application Data

(60) Provisional application No. 61/451,918, filed on Mar. 11, 2011.

(51) Int. Cl.
*G03B 27/54* (2006.01)
*G03F 7/20* (2006.01)

(52) U.S. Cl.
CPC .......... *G03F 7/705* (2013.01); *G03F 7/70091* (2013.01); *G03F 7/70616* (2013.01)

(58) Field of Classification Search
CPC .. G03F 7/70091; G03F 7/701; G03F 7/70108; G03F 7/70116; G03F 7/70125;
(Continued)

(56) References Cited

U.S. PATENT DOCUMENTS 6,337,662 B1 1/2002 Cassel
7,015,491 B2 3/2006 Eurlings et al.
(Continued)

FOREIGN PATENT DOCUMENTS

EP 1 628 164 2/2006

OTHER PUBLICATIONS

Jörg Zimmermann et.al., "Generation of arbitrary freeform source shapes using advanced illumination systems in high-NA immersion scanners," Proc. of SPIE, vol. 7640, pp. 764005-1-764005-15 (2010).

(Continued)

*Primary Examiner* — Christina Riddle
(74) *Attorney, Agent, or Firm* — Pillsbury Winthrop Shaw Pittman LLP

(57) ABSTRACT

A method of controlling a lithographic apparatus, the method including setting an illumination system of the lithographic apparatus to effect a selected illumination mode, measuring a value of a first parameter of the lithographic apparatus, calculating a value of a second parameter of a projected image of a feature of a test pattern having a plurality of features using a model of the lithographic apparatus and the measured value of the first parameter, and controlling the lithographic apparatus with reference to the calculated value of the second parameter.

20 Claims, 12 Drawing Sheets

(58) Field of Classification Search
CPC .. G03F 7/70133; G03F 7/705; G03F 7/70566;
G03F 7/70575; G03F 7/70616; G03F
7/70625; G03F 7/70666; G03F 7/70675
USPC ........ 355/52, 53, 55, 67–71, 77; 250/492.1,
250/492.2, 492.22, 493.1, 548
See application file for complete search history.

(56) References Cited

U.S. PATENT DOCUMENTS

| | | | |
|---|---|---|---|
| 7,525,642 | B2 | 4/2009 | Mulder et al. |
| 2002/0145719 | A1* | 10/2002 | Govil et al. ................. 355/69 |
| 2003/0192015 | A1* | 10/2003 | Liu .............................. 716/4 |
| 2004/0207824 | A1 | 10/2004 | Lof et al. |
| 2005/0084782 | A1* | 4/2005 | Sentoku ............... G03F 7/705 430/30 |
| 2005/0091633 | A1* | 4/2005 | Ye et al. .................... 716/20 |
| 2005/0273753 | A1* | 12/2005 | Sezginer .................... 716/21 |
| 2006/0003240 | A1* | 1/2006 | Shim et al. ................ 430/30 |
| 2006/0008716 | A1* | 1/2006 | Jeunink et al. ..... G03F 7/70258 430/30 |
| 2007/0050749 | A1* | 3/2007 | Ye et al. .................... 716/20 |
| 2008/0036983 | A1* | 2/2008 | De Mast et al. ........... 355/53 |
| 2008/0278698 | A1* | 11/2008 | Kazinczi et al. ........... 355/44 |
| 2008/0291412 | A1* | 11/2008 | Kazinczi et al. ........... 355/52 |
| 2009/0174877 | A1 | 7/2009 | Mulder et al. |

OTHER PUBLICATIONS

Jin-hyuck Jeon et al., "Analysis of the impact of pupil shape variation by pupil fit modeling," Proc. of SPIE, vol. 7640, pp. 76400Y-1-76400Y-12 (2010).

* cited by examiner

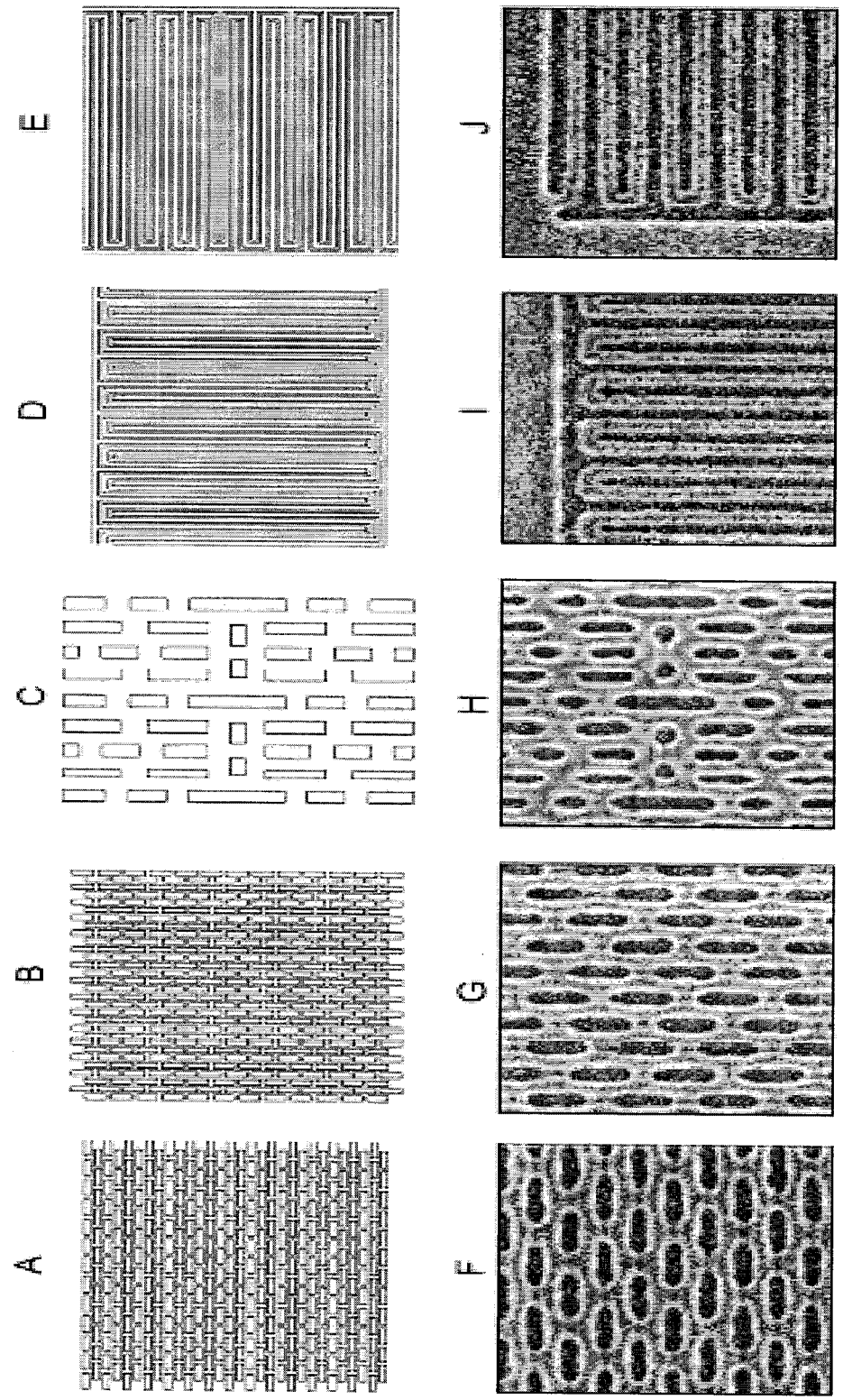

METHOD OF CONTROLLING A LITHOGRAPHIC APPARATUS, DEVICE MANUFACTURING METHOD, LITHOGRAPHIC APPARATUS, COMPUTER PROGRAM PRODUCT AND METHOD OF IMPROVING A MATHEMATICAL MODEL OF A LITHOGRAPHIC PROCESS

This application claims priority and benefit under 35 U.S.C. §119(e) to U.S. Provisional Patent Application No. 61/451,918, entitled "Method of Controlling A Lithographic Apparatus, Device Manufacturing Method, Lithographic Apparatus, Computer Program Product and Method of Improving a Mathematical Model of a Lithographic Process", filed on Mar. 11, 2011. The content of that application is incorporated herein in its entirety by reference.

FIELD

The present invention relates to a method of controlling a lithographic apparatus, a device manufacturing method, a lithographic apparatus, a computer program product for controlling a lithographic apparatus and a method of improving a mathematical model of a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

It is known in lithography that the manner of illumination of the patterning device, in particular the angles at which the exposure radiation is incident on the patterning device, affects the image printed on the substrate. Illumination modes are commonly, and most conveniently, described by describing the distribution of radiation in a pupil plane in the illumination system that is a Fourier transform of the patterning device plane. Thus, position in the pupil plane corresponds to angle at the pattering device plane. So-called conventional illumination has a disc of radiation in the pupil plane centered on the origin and results in the patterning device being illuminated with radiation arriving at a range of angles centered around the normal. Annular illumination has an annulus of radiation in the pupil plane. Off-axis multipole arrangements have, commonly, two or four poles arranged symmetrically about the origin, either on or off the X and Y axes. These different modes are known to be suitable for different types of pattern to be imaged. Complex patterns however may require a complex illumination mode for optimum imaging.

A diffractive optical element (DOE) that is custom made and placed in the illumination system in a plane conjugate with the patterning device but closer to the source than the pupil plane may be provided in order to define any desired illumination distribution in the pupil plane. However, design and manufacture of the diffractive optical element is expensive and time-consuming. Therefore, an arrangement may be provided to enable any desired illumination mode to be generated using a programmable array of individually-adjustable micro-mirrors. For a given pattern of a patterning device to be illuminated, a process known as source-mask optimization (SMO) is used to determine the optimum illumination mode for that pattern.

SUMMARY

In order to assist in development of lithographic processes, a number of mathematical models, or simulations, of a lithographic apparatus and lithographic process have been developed. Given a pattern to be imaged, or usually selected features from a pattern, and desired settings of the lithographic apparatus, e.g. an illumination mode, a prediction of the pattern as imaged can be calculated. By inverse prediction, or in an iterative process, it is possible to adjust the pattern or the lithography settings to improve the predicted image. In this way, a lithographic process can be optimized. Lithographic models are generally categorized into two types. Aerial image models generate a prediction of the image that will be projected by the projection system. Resist models predict the pattern that will be formed in developed resist and therefore include parameters of the resist and development process.

Once an optimum process for imaging of a desired pattern has been developed, it is performed to manufacture actual devices, usually in very high volumes. Therefore, manufacturing is usually not performed using the exact same apparatus as might have been used for developing the process. It is therefore necessary to ensure that the apparatus used for manufacturing matches the performance of the apparatus used for development. Having established such a match, it is also necessary to detect and correct for any drift in the apparatus used for manufacturing. To this end, so-called qualification tests are performed on each apparatus before it is deemed fit for use. Such tests confirm that the apparatus produces output consistent with the applied settings. Qualification tests may include printing of arrays of test patterns and measurement of parameters of the system, such as the actual illumination pupil effected when a given illumination mode is selected. The qualification tests, or a subset thereof, may be repeated periodically and/or after significant maintenance operations. Such qualification or calibration tests are time-consuming and interrupt use of the apparatus for productive work.

It is also possible to monitor the performance of a lithographic apparatus by making measurements of patterns actually printed onto substrates. Measurements may be taken of actual device patterns or of test patterns included in unused areas of the die. However, such measurements cannot be performed during the actual imaging process. Even with a fast metrology tool, such as a scatterometer, integrated into the lithocell, there is a significant delay between exposure of a substrate and measurement results being available. These measurement results therefore generally cannot be used to improve imaging of even subsequent substrates in the same batch, but may be applied to subsequent batches to which the same process is being applied.

It is desirable, for example, to provide an improved method and apparatus for control of a lithographic apparatus, in particular that allows inline feedback control and/or control of parameters of device patterns that cannot easily be directly measured.

According to an aspect of the invention, there is provided a method of controlling a lithographic apparatus, the lithographic apparatus having an illumination system arranged to illuminate a patterning device with radiation and a projection system arranged to project an image of the patterning device onto the substrate, the method comprising:
  setting the illumination system to effect a selected illumination mode;
  measuring a value of a first parameter of the apparatus;
  calculating a value of a second parameter of a projected image of a feature of a test pattern comprising a plurality of features using a model of the lithographic apparatus and the measured value of the first parameter; and
  controlling the lithographic apparatus with reference to the calculated value of the second parameter by changing a control setting of the apparatus.

According to an aspect of the invention, there is provided a device manufacturing method using a lithographic apparatus, the lithographic apparatus having a illumination system arranged to illuminate a patterning device and a projection system arranged to project an image of the patterning device onto the substrate, the method comprising:
  setting the illumination system to effect a selected illumination mode;
  imaging the pattern of a patterning device, the pattern comprising a plurality of features, onto the substrate using the illumination mode and the projection system;
  measuring a value of a first parameter of the apparatus;
  calculating a value of a second parameter of a projected image of a feature of the pattern using a model of the lithographic apparatus and the measured value of the first parameter; and
  controlling the lithographic apparatus with reference to the calculated value of the second parameter.

According to an aspect of the invention, there is provided a lithographic apparatus arranged to image a pattern comprising a plurality of features onto a substrate, the lithographic apparatus comprising:
  a support for a patterning device;
  a controllable illumination system arranged to illuminate the patterning device;
  a projection system arranged to project an image of the patterning device onto the substrate; and
  a control system arranged to:
    set the illumination system to effect a selected illumination mode;
    measure a value of a first parameter of the apparatus;
    calculate a value of a second parameter of a projected image of a feature of a test pattern comprising a plurality of features using a model of the lithographic apparatus and the measured value of the first parameter; and
    control the lithographic apparatus with reference to the calculated value of the second parameter.

According to an aspect of the invention, there is provided a computer program product comprising a computer-readable storage medium having stored thereon instructions for performing a method of controlling a lithographic apparatus, the lithographic apparatus having a programmable illumination system arranged to illuminate a patterning device with radiation and a projection system arranged to project an image of the patterning device onto the substrate, the method comprising:
  setting the illumination system to effect a selected illumination mode;
  measuring a value of a first parameter of the apparatus;
  calculating a value of a second parameter of a projected image of a feature of a test pattern comprising a plurality of features using a model of the lithographic apparatus and the measured value of the first parameter; and
  controlling the lithographic apparatus with reference to the calculated value of the second parameter.

According to an aspect of the invention, there is provided a method of improving a mathematical model of a lithographic process, the method comprising:
  applying a setting of a first parameter to a lithographic apparatus;
  measuring a value of the first parameter as adopted by the lithographic apparatus
  using the mathematical model to obtain a predicted value of a second parameter of an image of a pattern as it would be exposed on a substrate with reference to the measured value of the first parameter;
  using the lithographic apparatus to expose the pattern on a substrate;
  using a metrology tool to obtain a measured value of the second parameter of the pattern exposed on the substrate; and
  adapting the mathematical model with reference to the measured value of the second parameter and the predicted value of the second parameter

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 14 depicts some test patterns usable in embodiments of the invention and corresponding CD-SEM images.

DETAILED DESCRIPTION

Figure 1:
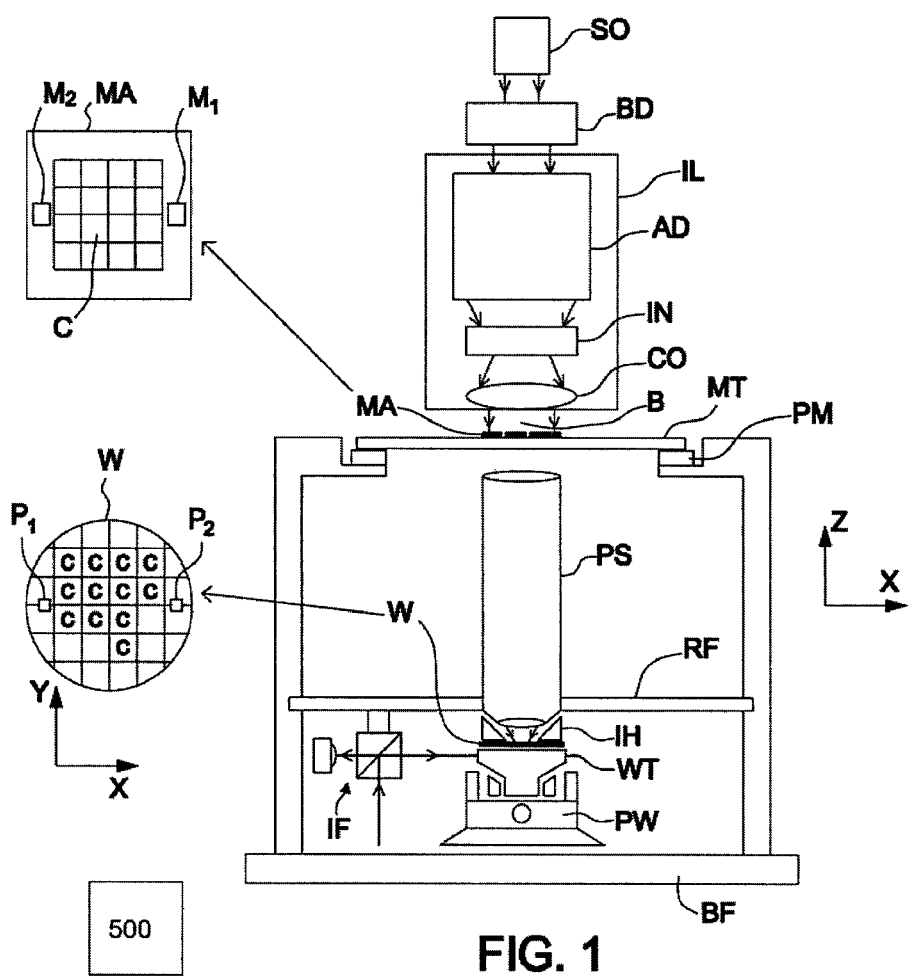
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation, DUV radiation or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

In many lithographic apparatus a fluid, in particular a liquid, is provided between the final element of the projection system to enable imaging of smaller features and/or increase the effective numerical aperture (NA) of the apparatus. An embodiment of the invention is described further below with reference to such an immersion apparatus, but may equally be embodied in a non-immersion apparatus. Arrangements for providing liquid between a final element of the projection system and the substrate can be classed into at least three general categories. These are the bath type arrangement, the so called localized immersion system and an all wet arrangement. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate.

Figure 2:
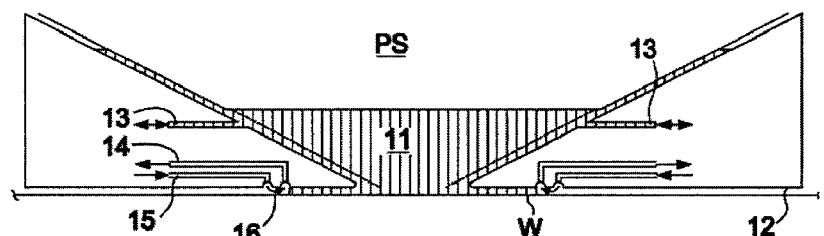
FIG. 2 depicts a liquid supply system for use in a lithographic projection apparatus.

An arrangement which has been proposed is to provide the liquid supply system with a liquid confinement member which extends along at least a part of a boundary of the space between the final element of the projection system and the substrate table. Such an arrangement is illustrated in FIG. 2. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

The fluid handling structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13.

Many other types of liquid supply system are possible. An embodiment of the present invention is not limited to any particular type of liquid supply system, nor to immersion lithography. An embodiment of the invention can be applied equally in any lithography.

A control system 500 controls the overall operations of the lithographic apparatus and in particular performs an optimization process described further below. Control system 500 may be embodied as a suitably-programmed general purpose computer comprising a central processing unit and volatile and non-volatile storage means. The computer may further comprise an input and output device such as a keyboard and screen, a connection to a network and an interface to the various parts of the lithographic apparatus. It will be appreciated that a one-to-one relationship between controlling computer and lithographic apparatus is not necessary. In an embodiment of the invention one computer may control multiple lithographic apparatuses. In an embodiment of the invention, multiple networked computers may be used to control one lithographic apparatus. The control system 500 may be configured to also control one or more associated process devices and substrate handling devices in a lithocell or cluster of which the lithographic apparatus forms a part. The control system 500 can be configured to be subordinate to a supervisory control system of a lithocell or cluster and/or an overall control system of a fab.

Figure 3:
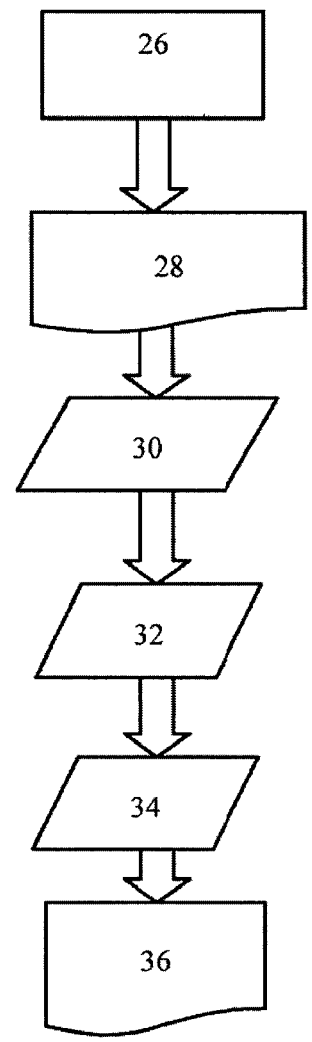
FIG. 3 depicts a lithographic simulation apparatus.

Prior to discussing an embodiment of the present invention, a brief discussion regarding lithography simulation and imaging process is provided. In a lithography simulation system, the major system components of a lithography apparatus can be described by separate functional modules, for example, as illustrated in FIG. 3. Referring to FIG. 3, the functional modules include the design layout module 26, which defines the target design layout; the patterning device layout module 28, which defines the patterning device to be utilized in imaging process; the patterning device model module 30, which defines the model of the patterning device layout to be utilized during the simulation process; the optical model module 32, which defines the performance of the optical components of lithography system; and the resist model module 34, which defines the performance of the resist being utilized in the given process. The result of the simulation process produces, for example, predicted contours and CDs in the result module 36.

More specifically, it is noted that the properties of the illumination and projection optics are captured in the optical model 32 that includes, but not limited to, NA and sigma (σ) settings as well as any particular illumination source shape, where σ (or sigma) is the outer radial extent of the illumination. The optical properties of the photo-resist layer coated on a substrate—i.e. refractive index, film thickness, propagation and polarization effects—may also be captured as part of the optical model 32. The patterning device model 30 captures the design features of the patterning device (e.g., mask) and may also include a representation of detailed physical properties of the patterning device. Finally, the resist model 34 describes the effects of chemical processes which occur during resist exposure, post-exposure bake (PEB) and development, in order to predict, for example, contours of resist features formed on the substrate. The objective of the simulation is to accurately predict, for example, edge placements and critical dimensions (CDs), which can then be compared against the target design. The target design is generally defined as the pre-optical proximity correction (OPC) patterning device layout, and will be provided in a standardized digital file format such as GDSII or OASIS. Those skilled in the art will understand that any input file format may be used.

Figure 4:
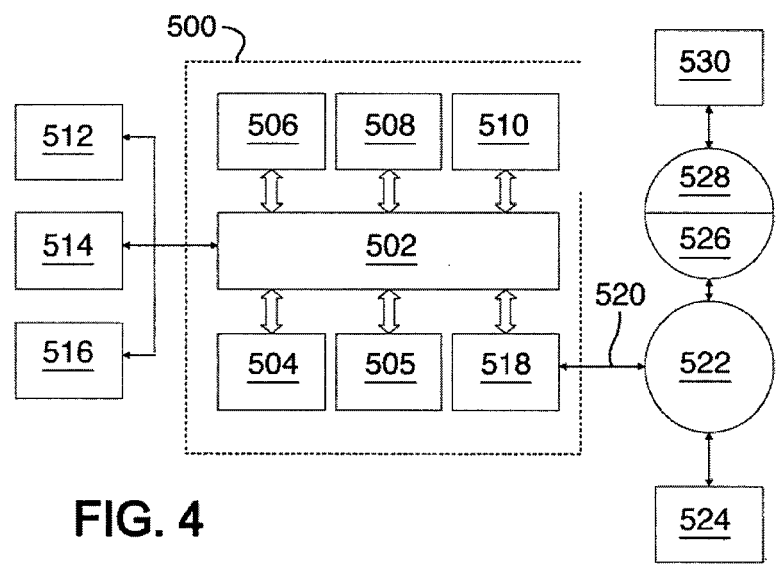
FIG. 4 depicts a computer system which may be used in an embodiment of the present invention.

FIG. 4 is an exemplary block diagram that illustrates a computer system 500 which can assist in embodying and/or implementing the pattern selection method disclosed herein. Computer system 500 includes a bus 502 or other communication mechanism to communicate information, and one or more processor(s) 504 (and 505) coupled with bus 502 to process information. Computer system 500 also includes a main memory 506, such as a random access memory (RAM) or other dynamic storage device, coupled to bus 502 to store information and instructions to be executed by processor 504. Main memory 506 may be used to store temporary variables or other intermediate information during execution of instructions to be executed by processor 504. Computer system 500 may further include a read only memory (ROM) 508 or other static storage device coupled to bus 502 to store static information and instructions for processor 504. A storage device 510, such as a magnetic disk or optical disk, may be provided and coupled to bus 502 to store information and instructions.

Computer system 500 may be coupled via bus 502 to a display 512, such as a cathode ray tube (CRT) or flat panel or touch panel display to display information to a computer user. An input device 514, including alphanumeric and other keys, may be coupled to bus 502 to communicate information and command selections to processor 504. Another type of user input device may be cursor control 516, such as a mouse, a trackball, or cursor direction keys to communicate direction information and command selections to processor 504 and to control cursor movement on display 512. This input device typically has two degrees of freedom in two axes, a first axis (e.g., x) and a second axis (e.g., y), that allows the device to specify positions in a plane. A touch panel (screen) display may be used as an input device.

According to one embodiment of the invention, portions of the simulation process may be performed by computer system 500 in response to processor 504 executing one or more sequences of one or more instructions contained in main memory 506. Such instructions may be read into main memory 506 from another computer-readable medium, such as storage device 510. Execution of the sequences of instructions contained in main memory 506 causes processor 504 to perform the process steps described herein. One or more processors in a multi-processing arrangement may be employed to execute the sequences of instructions contained in main memory 506. In an embodiment, hard-wired circuitry may be used in place of or in combination with software instructions to implement an embodiment of the invention. Thus, embodiments of the invention are not limited to any specific combination of hardware circuitry and software.

The term "computer-readable medium" as used herein refers to any medium that participates in providing instructions to processor 504 for execution. Such a medium may take many forms, including but not limited to, non-volatile media, volatile media, and transmission media. Non-volatile media include, for example, optical or magnetic disks, such as storage device 510. Volatile media include dynamic memory, such as main memory 506. Transmission media include coaxial cables, copper wire and fiber optics, including the wires that comprise bus 502. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, a RAM, a PROM, an EPROM, a FLASH-EPROM, a DRAM, a SRAM, any other memory chip or cartridge, a carrier wave as described hereinafter, or any other medium from which a computer can read.

Various forms of computer readable media may be involved in carrying one or more sequences of one or more instructions to processor 504 for execution. For example, the instructions may initially be borne on a magnetic disk of a remote computer. The remote computer can load the instructions into its dynamic memory and send the instructions over a wide area network, e.g. the Internet. A modem local to computer system 500 can receive the data on the telephone line and use an infrared transmitter to convert the data to an infrared signal. An infrared detector coupled to bus 502 can receive the data carried in the infrared signal and place the data on bus 502. Bus 502 carries the data to main memory 506, from which processor 504 retrieves and executes the instructions. The instructions received by main memory 506 may optionally be stored on storage device 510 either before or after execution by processor 504.

Computer system 500 may include a communication interface 518 coupled to bus 502. Communication interface 518 provides a two-way data communication coupling to a network link 520 that is connected to a local network 522. For example, communication interface 518 may be an integrated services digital network (ISDN) card or a modem to provide a data communication connection to a corresponding type of telephone line. As another example, communication interface 518 may be a local area network (LAN) card to provide a data communication connection to a compatible LAN. Wireless links may be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host computer 524 or to data equipment operated by an Internet service provider (ISP) 526. ISP 526 in turn provides data communication services through the Internet 528. Local network 522 and Internet 528 both use electrical, electromagnetic or optical signals that carry digital data streams. The signals through the various networks and the signals on network link 520 and through communication interface 518, which carry the digital data to and from computer system 500, are exemplary forms of carrier waves transporting the information.

Computer system 500 can send messages and receive data, including program code, through the network(s), network link 520, and communication interface 518. In the Internet example, a server 530 might transmit a requested code for an application program through Internet 528, ISP 526, local network 522 and communication interface 518. In accordance with an embodiment of the invention, one such downloaded application provides for the test pattern selection of the embodiment, for example. The received code may be executed by processor 504 as it is received, and/or stored in storage device 510, or other non-volatile storage for later execution. In this manner, computer system 500 may obtain application code in the form of a carrier wave.

In order to monitor the lithographic process, one or more parameters of the patterned substrate are measured. The parameters may include, for example, the overlay error between successive layers formed in or on the patterned substrate and/or critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and a property of the scattered or reflected beam is measured. By comparing the property of the beam before and after it has been reflected or scattered by the substrate, a property of the substrate can be determined. This can be done, for example, by comparing the reflected beam with data stored in a library of known measurements associated with a known substrate property. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Image-based overlay metrology is currently a mainstream overlay metrology technique. Diffraction based overlay (DBO) is, however, gaining momentum and acceptance at semiconductor manufacturers as the need for better precision increases.

An inspection apparatus is used to determine one or more properties of the substrates, and in particular, how the one or more properties of different substrates or different layers of the same substrate vary from layer to layer. The inspection apparatus may be integrated into the lithographic apparatus or the lithocell or may be a stand-alone device. To enable rapid measurements, it is desirable that the inspection apparatus measure a property in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of faulty substrates but may still provide useful information.

Figure 5:
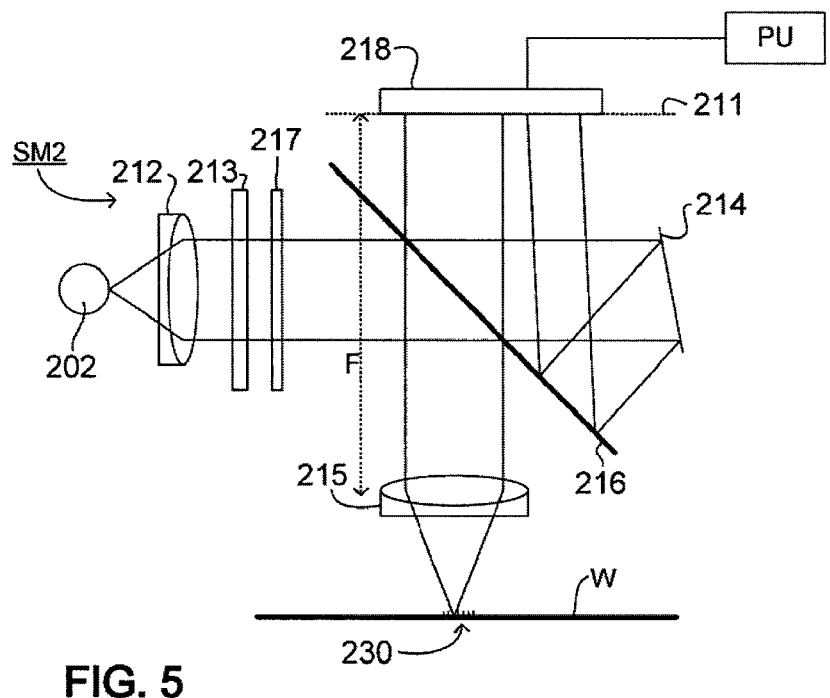
FIG. 5 depicts a metrology device which may be used in an embodiment of the present invention.

A scatterometer that may be used with an embodiment of the present invention is shown in FIG. 5. In this device, the radiation emitted by radiation source 202 is collimated using lens system 212 and transmitted through interference filter 213 and polarizer 217, reflected by partially reflected surface 216 and is focused onto substrate W via a microscope objective lens 215, which has a high numerical aperture (NA), desirably at least 0.9 or at least 0.95. An immersion scatterometer may even have a numerical aperture over 1. The reflected radiation then transmits through partially reflecting surface 216 into a detector 218 in order to have the scatter spectrum detected. The detector may be located in the back-projected pupil plane 211, which is at the focal length F of the lens system 215, however the pupil plane may instead be re-imaged with auxiliary optics (not shown) onto the detector. The pupil plane is the plane in which the radial position of radiation defines the angle of incidence and the angular position defines azimuth angle of the radiation. The detector is desirably a two-dimensional detector so that a two-dimensional angular scatter spectrum of a substrate target 230 can be measured. The detector 218 may be, for example, an array of CCD or CMOS sensors, and may use an integration time of, for example, 40 milliseconds per frame.

A reference beam is often used, for example, to measure the intensity of the incident radiation. To do this, when the radiation beam is incident on the beam splitter 216 part of it is transmitted through the beam splitter as a reference beam towards a reference mirror 214. The reference beam is then projected onto a different part of the same detector 218 or alternatively on to a different detector (not shown).

A set of interference filters 213 is available to select a wavelength of interest in the range of, say, 405-790 nm or even lower, such as 200-300 nm. The interference filter may be tunable rather than comprising a set of different filters. A grating could be used instead of interference filters.

The detector 218 may measure the intensity of scattered radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

Using a broadband radiation source (i.e. one with a wide range of radiation frequencies or wavelengths—and therefore of colors) is possible, which gives a large etendue, allowing the mixing of multiple wavelengths. The plurality of wavelengths in the broadband desirably each has a bandwidth of Δλ and a spacing of at least 2 Δλ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in European patent application publication no. EP1,628,164.

The target 230 on substrate W may be a 1-D grating, which is printed such that after development, the bars are formed of solid resist lines. The target 230 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay metrology. Overlay metrology is a measuring system in which the overlay of two targets is measured in order to determine whether two layers on a substrate are aligned or not. CD uniformity is simply a measurement of the uniformity of the grating on the spectrum to determine how the exposure system of the lithographic apparatus is functioning. Specifically, CD is the width of the object that is "written" on the substrate and is the limit at which a lithographic apparatus is physically able to write on a substrate.

Using one of the scatterometers described above in combination with modeling of a target structure such as the target 230 and its diffraction properties, measurement of the shape and other parameters of the structure can be performed in a number of ways. In a first type of process, a diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. In a second type of process, diffraction spectra for many different candidate structures are calculated in advance to create a 'library' of diffraction spectra. Then the diffraction pattern observed from the measurement target is compared with the library of calculated spectra to find a best fit. Both methods can be used together: a coarse fit can be obtained from a library, followed by an iterative process to find a best fit.

Figure 6:
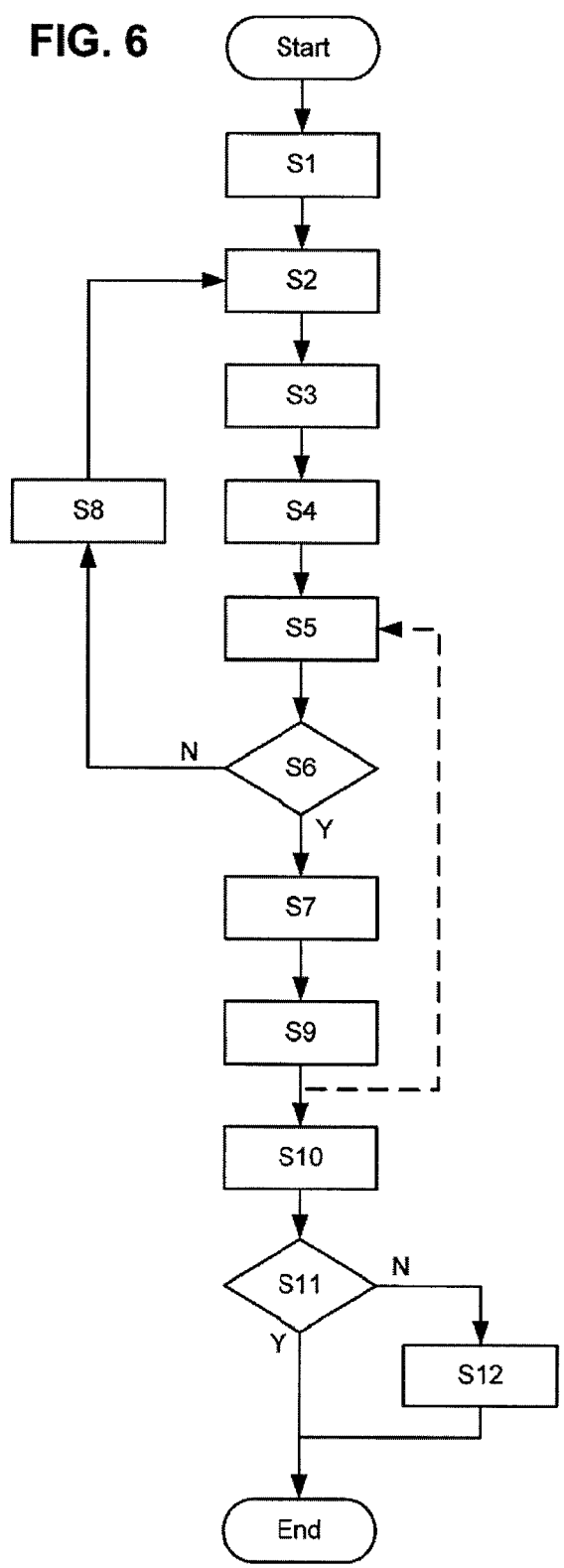
FIG. 6 is a flow chart of a method according to an embodiment of the invention of optimizing a device manufacturing method.

A method of optimizing an imaging process according to an embodiment of the invention is shown in FIG. 6. The steps of the method are, in an embodiment, automated but manual intervention in one or more steps can be allowed. In an embodiment of the present invention, the optimized process recipe, and the outputs of optimization steps within the method of an embodiment of the invention, need not be globally optimum solutions. Rather the term optimization is used herein to refer to a process that identifies values for imaging parameters that provide an improvement, e.g. a local optimum, in at least one relevant metric, compared to an initial set of values for those parameters. "Optimum" and other related terms should be construed accordingly. In an embodiment of the present invention, optimization steps can be applied iteratively to provide further improvements in one or more metrics. By way of example optimization in an embodiment of the invention may provide an improvement of one or more metrics selected from the group consisting of: feature placement accuracy, best focus difference, Bossung tilt, pattern asymmetry, pattern asymmetry through focus, CD, CD uniformity, CD uniformity through focus, and/or top-bottom difference.

Additional information regarding the use of diffractive optical elements or reflective elements to create illumination shapes in the pupil plane of the illumination system can be gleaned from U.S. Pat. Nos. 7,015,491, 6,337,662, 7,525, 642 and U.S. Patent Application Publication No. 2009-0174877, the contents of which are incorporated herein in their entireties by reference.

In a conventional lithographic apparatus, a subset of available imaging performance indicators—such as the state of the illumination pupil, polarization of the radiation beam, bandwidth of the source, pulse repetition rate, projection system settings such as aberration and stray radiation, the dynamic status of the patterning device (e.g., mask) stage and substrate stage, effective focal positions and dose—are monitored manually if at all. Other performance indicators are reviewed only during qualification and periodic re-calibration procedures. The manual monitoring of those performance indicators that are monitored is time-consuming and therefore may not be performed sufficiently to meet the requirements imposed by decreasing critical dimensions and process windows, for example, now demanded. In particular, the illumination pupil is becoming increasingly critical for imaging performance. With more complex pupils defined by, for example, diffractive optical elements or programmable devices, it may no longer be possible to define the illumination pupil using a small number of readily understood parameters. Consequently it is difficult to monitor whether the actual pupil effected is that which was intended. Even if deviations from the intended pupil can be identified, it may difficult to determine the effect of such deviations on the ultimately formed devices. Programmable phase control devices in the projection system may have similar issues.

Accordingly, an embodiment of the present invention provides a new control method and apparatus which aims to allow rapid identification of issues in imaging, as well as quantifying their effect on output devices and as far as possible identifying the root cause, and mitigating their effect.

In an embodiment of the invention, depicted in FIG. 6, a pattern to be imaged is selected S1 and apparatus settings, e.g. an illumination mode, are determined S2. The settings are applied S3 to the apparatus. Next, a value of a first parameter of the lithographic apparatus as set up for imaging is measured S4. This value is provided to a mathematical model, or simulation, of the lithographic apparatus or process which is then used to calculate S5 a value of a second parameter of the aerial image of the pattern to be imaged or the pattern as formed on the substrate. The calculated value is then used to control the lithographic apparatus to improve imaging. For example, the calculated value may be compared S6 to a desired value and if the comparison is satisfactory, imaging proceeds S7. If the comparison is unsatisfactory, remedial action S8 is taken and the setup, etc., steps are repeated. By use of a suitably rapid measurement technique and simulation, it is possible in this way to effect inline control during exposure of a substrate or a batch of substrates.

In a particular embodiment, the first parameter is the illumination pupil which is measured using an interferometric sensor system integrated into the illumination system of the lithographic apparatus. The second parameter, whose value is calculated, is the critical dimension (CD) of a pattern formed in resist. In an embodiment, the second parameter is CD uniformity. A value for critical dimension or critical dimension uniformity can be immediately understood by the lithographer and the severity of any imaging issue immediately judged. The root cause of any imaging issue can be identified through the model, e.g. by repeated simulations with varying inputs, and using a sophisticated metrology tool such as a scatterometer.

Use of the model provides a significant advantage. In particular, the model simulation can be performed sufficiently fast to allow a correction to be effected within the same substrate or batch of substrates, reducing the number of defective exposures. An advantage of an embodiment of the invention is that the model can be used to predict the effect of imaging conditions actually pertaining in the apparatus on features or feature parameters that might not easily be measurable.

The remedial action to be taken in the event that an imaging issue is detected will depend on the embodiment of the invention as well as the specific issue identified. Examples of remedial action that can be taken are adjustment of: a setting of a programmable illumination device; a zoom-axicon setting; a stray radiation compensation setting; a setting of a dose control device, in particular one which allows for control of dose along the length of an illumination slit; a setting of a polarization control device in the illumination system; a setting of a programmable phase control device in the projection system; and/or other standard controls of a lithographic apparatus. In some instances, the amount of correction to be applied will be directly derivable from the image prediction, in other cases it can be found by iterative simulation or modeling.

In an embodiment of the invention, after actual printing of patterns on a substrate the second parameter is measured S9 in the exposed substrate. In an embodiment, a scatterometer is used to measure the value of the second parameter. If necessary, the value of the second parameter is devised by calculation S10 from the output of the metrology device rather than directly provided. The scatterometer is desirably integrated into the lithocell containing the lithographic apparatus in order to reduce measurement delays. Having obtained a measured value for the second parameter, this is compared S11 to the calculated value of the second parameter. Such a comparison allows the mathematical model of the lithographic apparatus or process to be calibrated and improved S12. In an embodiment of the invention, metrology data from examination of expound substrates is used in the main control loop.

It is desirable to select a feature or features for modeling in an embodiment of the invention that is sensitive to variation in the imaging parameter of interest. A suitable feature can be selected by modeling the effect of variation in the imaging parameter of interest on a library of standard test patterns and/or device features. In an embodiment of the invention, the features used are line-space patterns with various values of CD and/or pitch. Line-end features and lines with breaks are also useable in embodiments of the invention. Examples of some suitable test patterns and scanning electron microscope images of these patterns as imaged are shown in FIG. 14.

Figure 7:
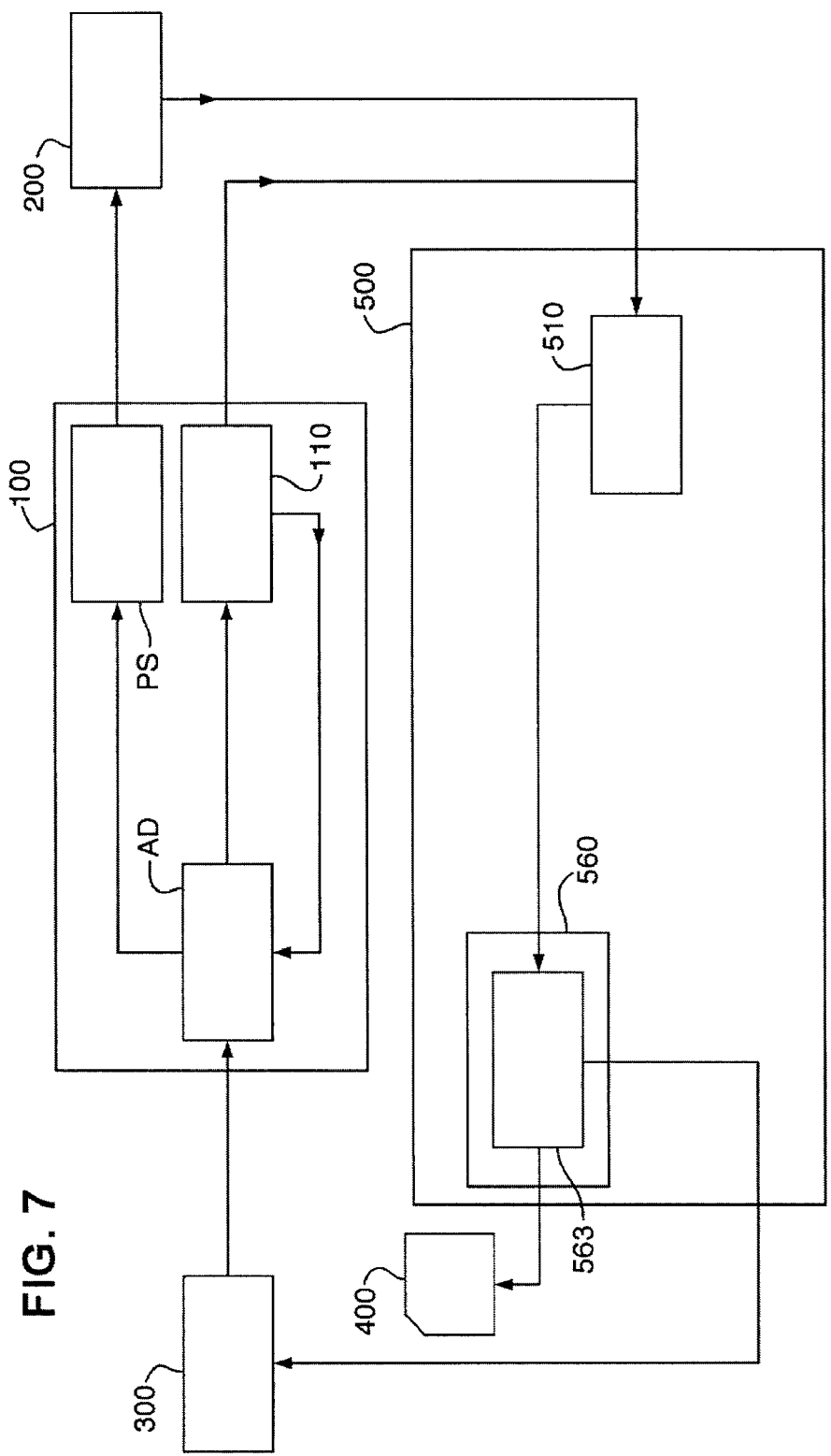
FIG. 7 depicts a control system of a lithographic apparatus according to an embodiment of the invention.

An embodiment of the invention is depicted in FIG. 7. The lithographic apparatus 100 includes an adjuster AD to control the illumination of the patterning device (not shown in this Figure). In an embodiment, adjuster AD includes a programmable device, such as a mirror array, to define an intensity distribution of the illumination radiation in a pupil plane of the illumination system. The lithographic apparatus has a Kohler illumination setup so that position in the pupil plane of the illumination system corresponds to angle of illumination at the patterning device. The lithographic apparatus 100 also includes an integrated interferometric sensor system 110 to measure the actual distribution of intensity in the pupil plane. Projection system PS projects an image of the patterning device onto a substrate.

The output of the integrated interferometric sensor 110 is fed back to the programmable illumination defining device AD to provide feedback control on the intensity distribution and minimize variations from the desired distribution as far as possible. Nevertheless, such differences will, in practice, occur. In an embodiment of the invention, the output of the integrated interferometric sensor system 110 is also provided to the controller 500 which includes a storage device 510 for storage of this, and other data. Storage device 510 can be embodied as a hard disk or other computer readable storage device as desired. The data of the pupil intensity distribution is passed to processor 560 which applies a mathematical model 563 of the lithographic apparatus and the lithographic process and outputs data 400 indicative of the critical dimension (CD) of the predicted image of the pattern. The CD data 400 is used, either in an automated control system or manually by the lithographer, to control parameters of the lithographic apparatus 100 to improve imaging.

When imaging is performed, substrates that have been exposed, and optionally developed, are passed to a metrology tool 200 for measurement of a value of the second parameter. The metrology tool 200 is, in an embodiment, a scatterometer measuring critical dimension and/or side wall angle (SWA). It is not necessary for all exposed substrates to be measured; a sample of substrates and a sample of features within the sample of substrates may be measured. The actual measured data is also passed to the storage device 510 and is compared with corresponding predicted results to calibrate or improve mathematical model 563. The results of the prediction are also provided to a pupil recovery controller 300 which calculates adjustments to be made to the programmable illumination defining device AD to improve its operation.

The data from the process of measuring exposed substrates may not be available for one or more days so that the storage device 510 should have sufficient capability to store the necessary data derived from several days of operations of the apparatus 100. Processor 560 is a general purpose computing device. It is desirable for such a device to be optimized to perform the calculations for lithographic simulation as is known in the art.

Figure 8:
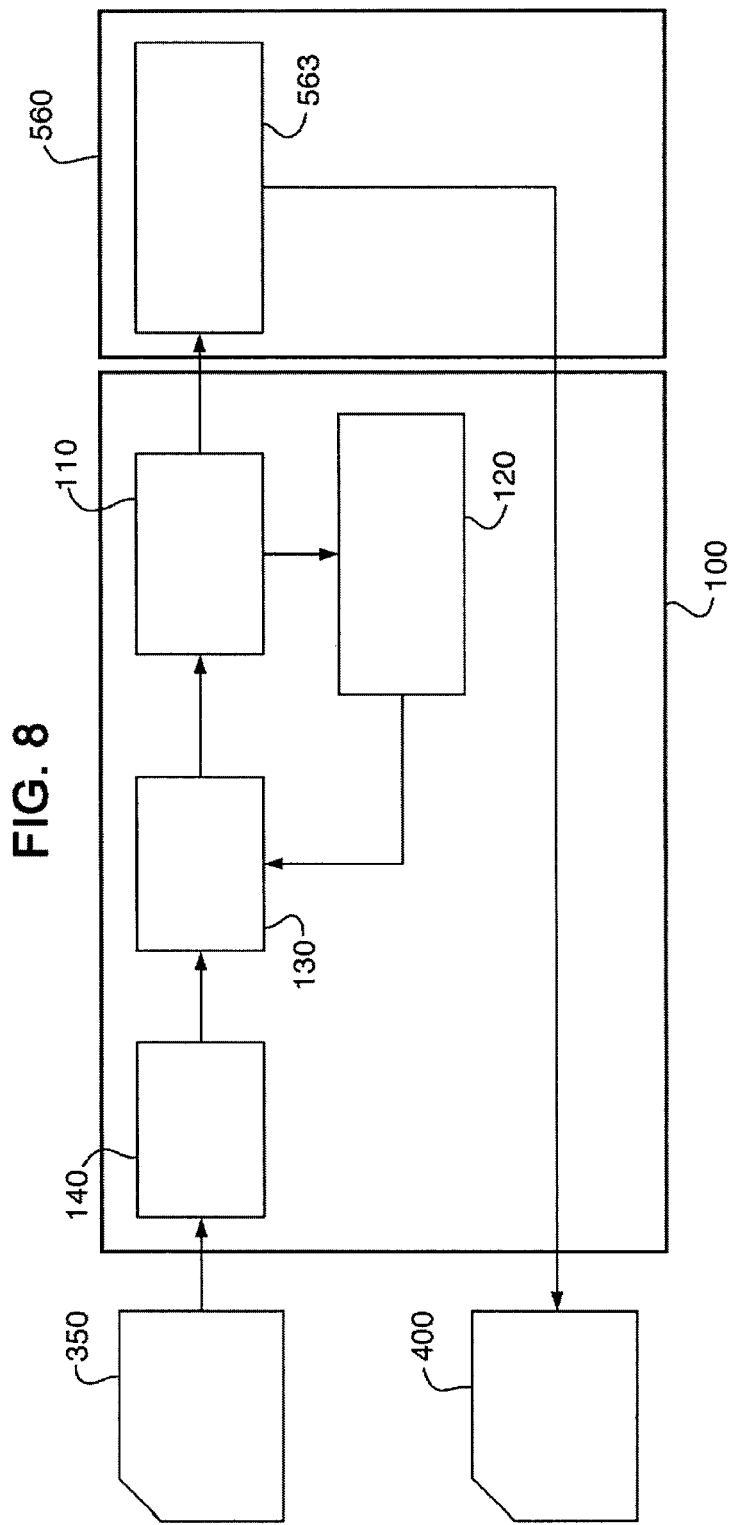
FIG. 8 depicts a control system of a lithographic apparatus according to an embodiment of the invention.

FIG. 8 illustrates an embodiment of the invention used to improve the illumination setting for a lithographic process. As input, an initial target intensity distribution 350, e.g. in the form of a bitmap, is input to mirror assignment device 140. Mirror assignment device determines the positions that the mirrors of a programmable intensity distribution device are to be set to effect as close as possible the target intensity distribution. A root mean square (rms) minimization routine is used to determine the optimum assignment. The resulting mirror assignments are provided to mirror control section 130 which effects setting of the mirrors to the desired positions. Mirror control system 130 includes localized feedback and calibration systems to minimize assignment error.

Integrated interferometric sensor 110 measures the actual intensity distribution in the pupil plane. A local feedback controller 120 calculates corrections to make the actual intensity distribution as close as possible to the distribution resulting from the mirror assignment and provides such corrections to mirror control section 130. The actual measured intensity distribution is provided to processor 560 which applies mathematical model 563 to calculate the effect on critical dimension and/or critical dimension uniformity of the actual intensity distribution. The CD data 400 obtained from this simulation are output for use in controlling the lithographic apparatus and/or determining if it has passed qualification tests. As described above, this process uses one or more test features selected as being sensitive to variations in the intensity distribution.

Figure 9:
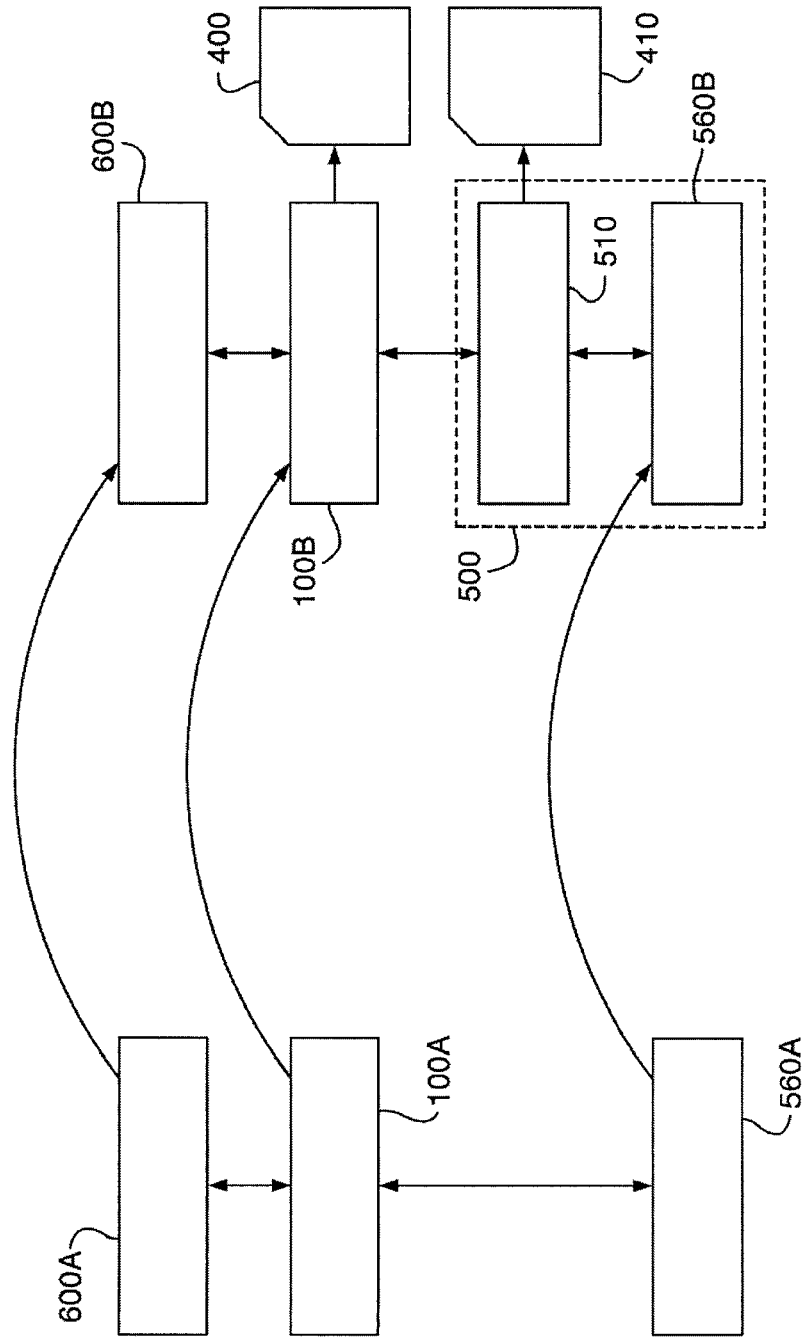
FIG. 9 depicts the development of a recipe for a lithographic manufacturing method according to an embodiment of the invention.

FIG. 9 illustrates the use of an embodiment of the invention in process development and high volume manufacturing. In process development, a fully featured mathematical model 560A of the lithographical apparatus and process is used. This exchanges data with a first lithographic apparatus 100A and a first process track 600A. Following modeling of a process, actual exposures are carried out and tested until the desired process is achieved. At this point, the data is transferred from the development model 560A to a production model 560B in a lithocluster controller 500. This production model 560B is a reduced version of the development model 560A, containing only those aspects of the fully featured model that are used to predict the parameters to be monitored. Such a reduced model can operate more quickly or using a less powerful processor. In an embodiment of the invention, a full model is used. Similarly, lithographic apparatus setup data, for example illumination modes and patterning devices, etc. are transferred from development apparatus 100A to lithographic apparatus 100B. Resist and other process recipes are transferred from development track 600A to production track 600B. In this embodiment, controller 500 is arranged to control a plurality of production lithographic apparatuses 100B and storage device 510 stores the measurement data generated by each of the controlled lithographic apparatuses. Reports 400, 410 identifying imaging issues are output by lithographic apparatus 100B and lithographic controller 500 as desired.

Figure 10:
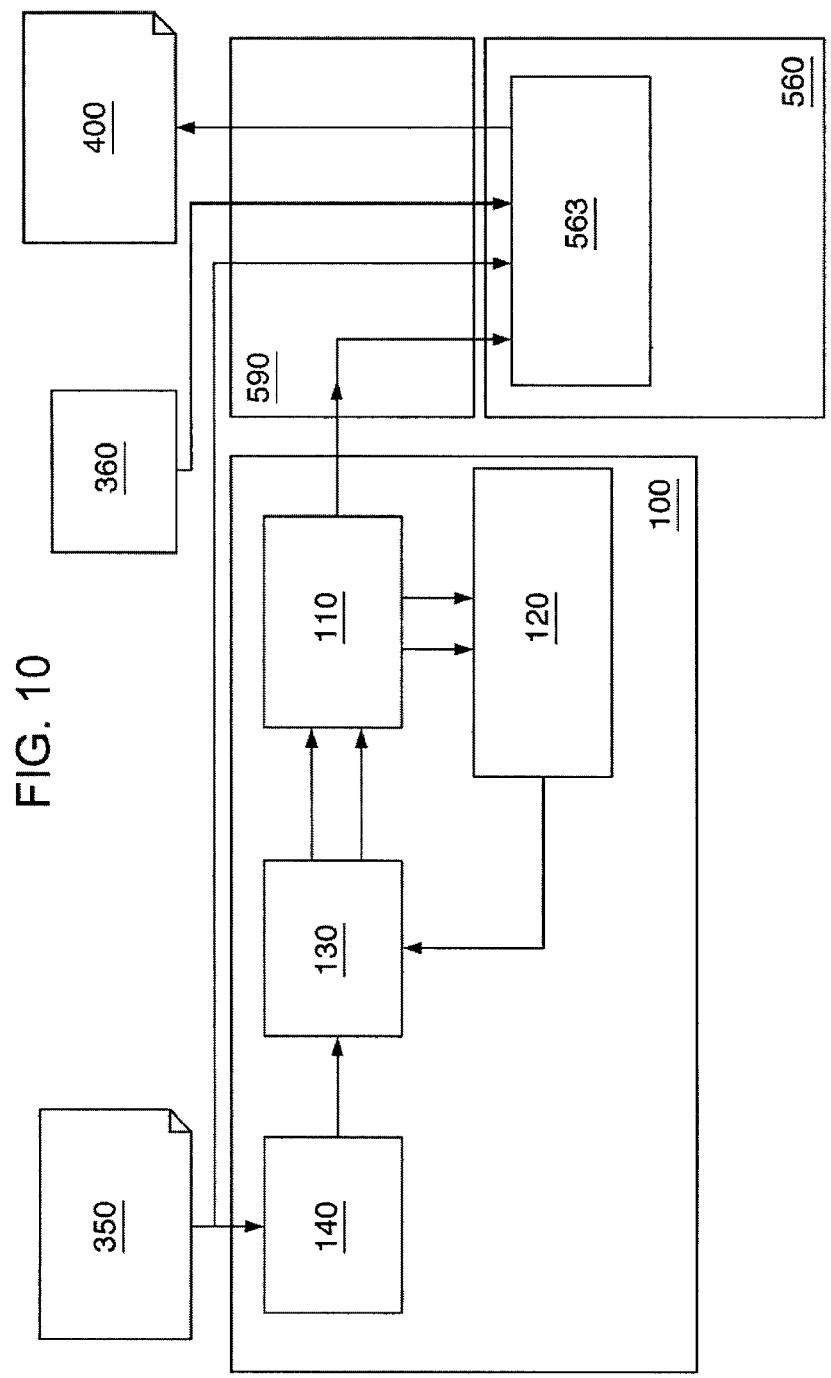
FIG. 10 depicts an analysis apparatus according to an embodiment of the invention.

FIG. 10 shows in greater detail the architecture of the modeling arrangements of an embodiment of the present invention. In this embodiment, the simulator 560 is provided separately from the lithographic apparatus 100 and a lithographic server 590 is provided to mediate communications between the lithographic apparatus 100 and simulator 560. In this way, simulator 560 can serve multiple lithographic apparatuses 100. The target pupil 350 is provided both to lithographic apparatus 100 and to simulator 560, via lithographic server 590. Other simulation setup data 360, including specifications for allowable variation in the monitored parameter, e.g. CD, is also provided to simulator 560 via lithographic server 590. This data is previously generated, e.g. during the development process for the device pattern to be imaged.

Figure 11:
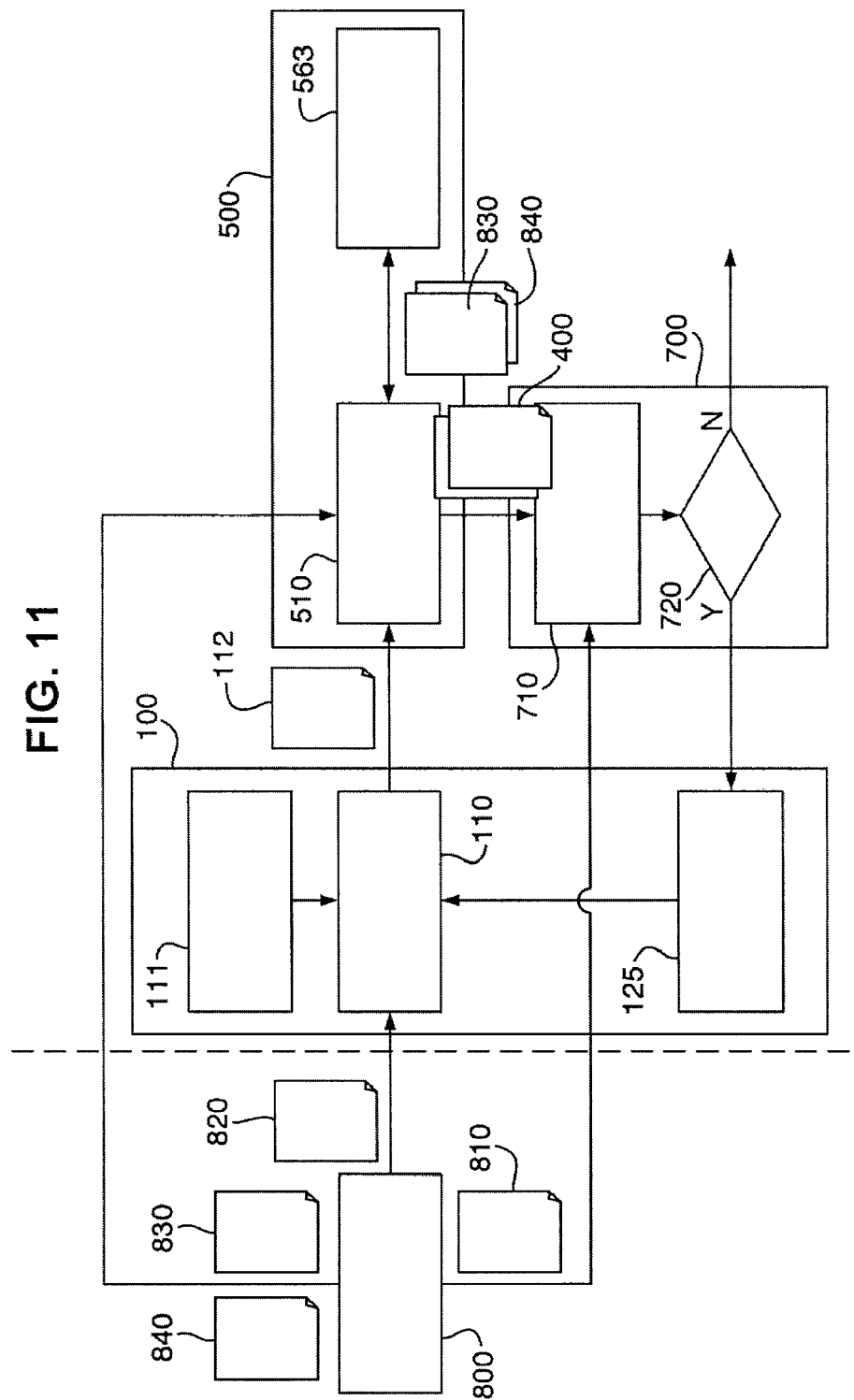
FIG. 11 depicts a control system of a lithographic apparatus according to an embodiment of the invention.

FIG. 11 illustrates a method of monitoring and control of the illumination pupil in a method according to an embodiment of the present invention. The method begins with process development 800 which provides as output a design pupil 810, simulation process setup data 830, qualification structure data 840, e.g. in a graphical data signal format, and CD control limit data 820. In actual manufacture, the pupil is measured by sensor 110 driven by a scheduler 111. Measured pupil data 112 is passed to data storage device 510 in controller 500. The simulation process setup data 830 and qualification structure data 840 are also stored in data storage device 510. These items and the illumination data 112 are passed to simulator 563 which generates CD data 400. CD data 400 is stored in data storage 510 and passed, as necessary to fab data controller 700. Fab data controller 700 includes a data interpreter 710 that receives CD control limit data 820 from process development 800 and determines 720 whether or not remedial action is required. If remedial action is required, then an adjustment to the illumination pupil is calculated at 125 and effected in the lithographic apparatus 100. If no amendments are required manufacturing continues.

Figure 12:
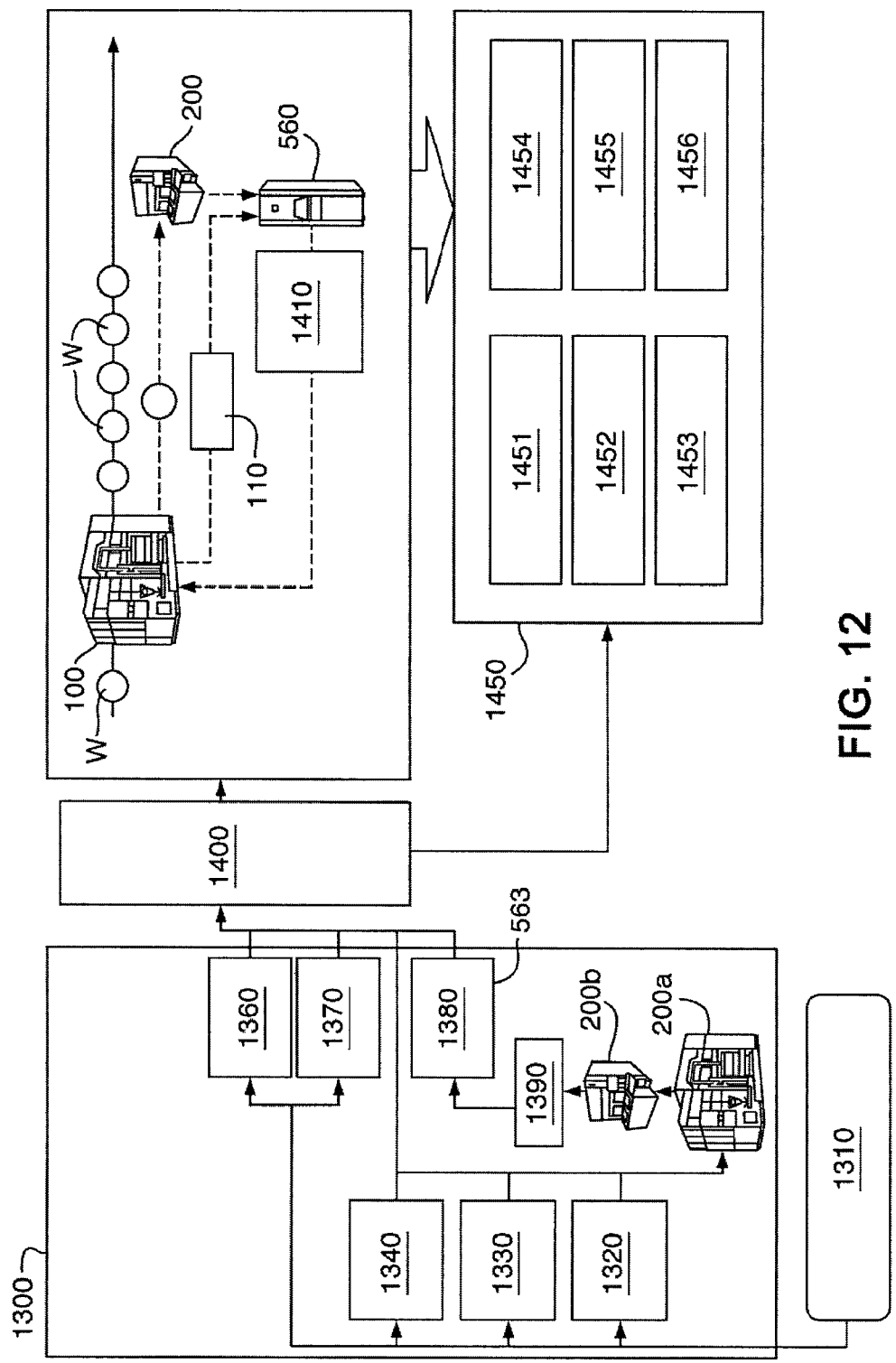
FIG. 12 depicts a device manufacturing method according to an embodiment of the invention.

A further embodiment of the present invention is illustrated in FIG. 12. The first part of the process is a set-up 1300 which is based on inputted process data 1310 which defines the recipe to be applied, e.g., including a resist process to be applied after imaging. Based on this data, imaging settings are selected 1320, CDU measures are selected 1330 and imaging module measures are selected 1340. This data is supplied to development lithographic apparatus 200a and test exposures carried out. Features of the test exposures are measured by production metrology device, e.g. a scatterometer, 200b and the results 1390 are used to generate model data 1380 to form a simulation model of the desired process. The input process data is also used to determine control limits 1360 and a scheme 1370 for measurement of the relevant parameters of the imaging process. The results of the setup procedure are formed into an input file 1400 that is passed to high volume manufacturing.

Once high volume manufacturing begins, production lithographic apparatus 100 exposes a sequence of substrates W some of which are passed to metrology device 200, e.g. a scatterometer. Integrated sensors 110 also provide data of actual conditions pertaining during exposures. This data and the output of metrology device 200 are provided to analyzer 560 which uses the metrology model to analyze the cause of any imaging issues. Any identified causes are passed to controller 1410 which determines appropriate remedial action to be carried out. Data output 1450 from the production process is also used in a trend analysis reporting and warning process. Based on the original input file and data from the production process, this process provides data 1450 of CDU intra-field variations 1451, CDU interfield variations 1452, CDU through pitch 1453, root cause identification 1454, early warning indicators 1455 and process modification recommendations 1456.

Figure 13:
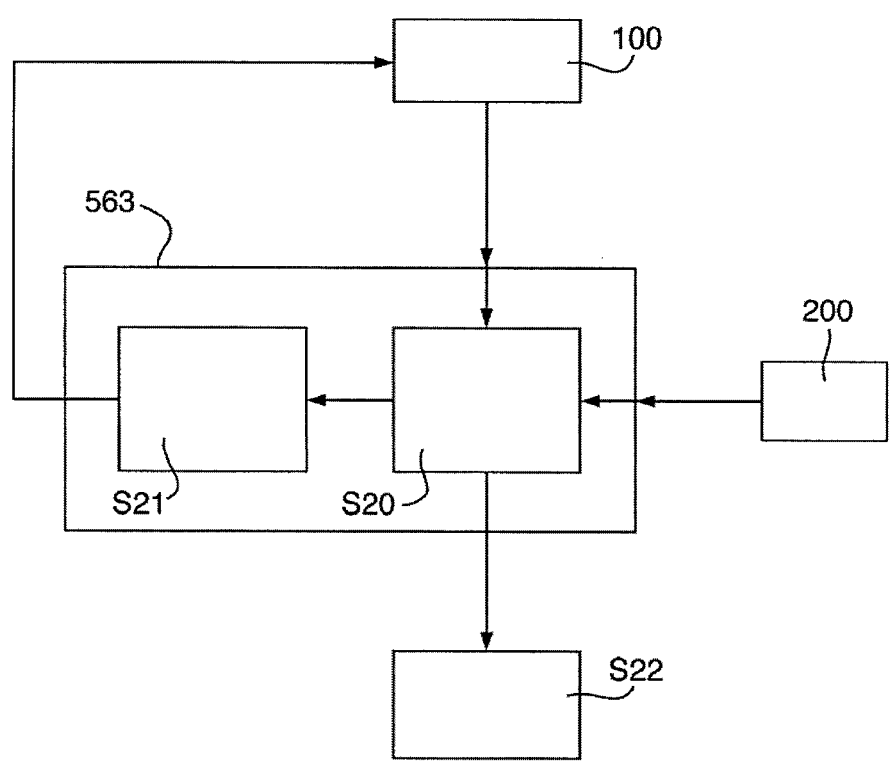
FIG. 13 depicts a device manufacturing method according to an embodiment of the invention.

An embodiment of the invention is depicted schematically in FIG. 13. In this embodiment, data of measured parameters of the lithographic apparatus 100, e.g. the measured illumination pupil, are supplied to model 563. Also supplied to the model 563 are measured data of actual exposed substrates provided from metrology device 200. The model is operated in an initial prediction step S20 to predict values for the image parameters that are measured by the metrology device 200. The predicted values are compared to the measured value in order to verify the accuracy of the model. If the model accuracy is deemed sufficient, in a second prediction step S21, more complex device features are modeled and the results of the modeling are used to control the lithographic apparatus. In the event that comparison of the simulated parameter values and the measured parameter values indicates that the model accuracy is insufficient, the model is improved S22 by adjusting relevant parameters.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

Embodiments of the invention may further include as described in the following clauses:

1. A method of controlling a lithographic apparatus, the lithographic apparatus having an illumination system arranged to illuminate a patterning device with radiation and a projection system arranged to project an image of the patterning device onto the substrate, the method comprising:
   setting the illumination system to effect a selected illumination mode;
   measuring a value of a first parameter of the apparatus;
   calculating a value of a second parameter of a projected image of a feature of a test pattern comprising a plurality of features using a model of the lithographic apparatus and the measured value of the first parameter; and
   controlling the lithographic apparatus with reference to the calculated value of the second parameter by changing a control setting of the apparatus.

2. The method according to clause 1, wherein the second parameter is one or more selected from the group consisting of: critical dimension; critical dimension uniformity; and critical dimension through pitch.

3. The method according to clause 1 or clause 2, wherein the first parameter is one or more selected from the group consisting of: intensity at one or more positions in a pupil plane of the illumination system; bandwidth of the radiation; apodization of the projection system; and polarization of the radiation.

4. The method according to any of clauses 1 to 3, wherein calculating a value of the second parameter comprises calculating values of the second parameter for respective one of the plurality of features of the test pattern, the plurality of features including features that are different in pitch, or orientation, or both pitch and orientation.

5. The method according to any of clauses 1 to 4, wherein changing the control setting affects the first parameter.

6. The method according to any of clauses 1 to 5, wherein the model is one or more selected from the group consisting of: an aerial image model and a resist model.

7. The method according to any of clauses 1 to 6, further comprising:

performing an exposure of the test pattern onto a substrate; measuring a value of the second parameter in a pattern formed on the substrate; and comparing the calculated value of the second parameter and the measured value of the second parameter.

8. The method according to clause 7, further comprising adjusting the model of the lithographic apparatus with reference to the comparison between the calculated value of the second parameter and the measured value of the second parameter.

9. The method according to clause 7 or clause 8, wherein measuring the value of the second parameter is performed using a scatterometer.

10. The method according to any of the preceding clauses, wherein the illumination mode defines intensity distribution across directions of illumination of the patterning device.

11. The method according to clause 10, wherein the illumination system comprises a programmable device arranged to direct radiation into a plurality of directions of illumination of the patterning device.

12. The method according to clause 11, wherein the programmable device comprises an array of individually controllable mirrors.

13. The method according to clause 12, further comprising adjusting an offset value applied to at least one of the individually controllable mirrors with reference to the calculated value of the second parameter.

14. The method according to any of the preceding clauses, wherein controlling the lithographic apparatus with reference to the calculated value of the second parameter comprises using the calculated value to determine a setting of one or more selected from the following:

a position of a mirror in a programmable mirror array used to define the illumination mode;

a setting of a zoom-axicon device;

a setting of a dose control device, such as a device that controls dose as a function of position along an illumination slit;

a setting of a radiation source, such as an intensity of a laser, a pulse repetition rate, a bandwidth, or a polarization state;

a setting of a projection system, such as an aberration control, a programmable phase control device or a lens heating control; and a setting of a support of the patterning device or the substrate, such as a position, velocity or acceleration set point.

15. The method according to any of the preceding clauses, wherein the method is performed prior to use of the apparatus for production of devices.

16. The method according to any of the preceding clauses, wherein the method is performed periodically.

17. A device manufacturing method using a lithographic apparatus, the lithographic apparatus having a illumination system arranged to illuminate a patterning device and a projection system arranged to project an image of the patterning device onto the substrate, the method comprising:

setting the illumination system to effect a selected illumination mode;

imaging the pattern of a patterning device, the pattern comprising a plurality of features, onto the substrate using the illumination mode and the projection system;

measuring a value of a first parameter of the apparatus;

calculating a value of a second parameter of a projected image of a feature of the pattern using a model of the lithographic apparatus and the measured value of the first parameter; and controlling the lithographic apparatus with reference to the calculated value of the second parameter.

18. The method according to clause 17, wherein the second parameter is one or more selected from the group consisting of: critical dimension; critical dimension uniformity; and critical dimension through pitch.

19. The method according to clause 17 or clause 18, wherein the first parameter is one or more selected from the group consisting of: intensity at one or more positions in a pupil plane of the illumination system; bandwidth of the radiation; apodization of the projection system; and polarization of the radiation.

20. The method according to any of clauses 17 to 19, wherein calculating a value of the second parameter comprises calculating values of the second parameter for a respective one of the plurality of features, the plurality of features including features that are different in pitch, or orientation, or both pitch and orientation.

21. The method according to any of clauses 17 to 20, wherein controlling the lithographic apparatus affects the first parameter.

22. The method according to any of clauses 17 to 21, wherein the model is one or more selected from the group consisting of: an aerial image model and a resist model.

23. The method according to any of clauses 17 to 22, further comprising:

performing an exposure of the pattern onto a substrate;

measuring a value of the second parameter in a pattern formed on the substrate; and comparing the calculated value of the second parameter and the measured value of the second parameter.

24. The method according to clause 23, further comprising adjusting the model of the lithographic apparatus with reference to the comparison between the calculated value of the second parameter and the measured value of the second parameter.

25. The method according to clause 23 or clause 24, wherein measuring the value of the second parameter is performed using a scatterometer.

26. The method according to any of clauses 17 to 25, wherein the illumination mode defines intensity distribution across directions of illumination of the patterning device.

27. The method according to clause 26, wherein the illumination system comprises a programmable device arranged to direct radiation into a plurality of directions of illumination of the patterning device.

28. The method according to clause 27, wherein the programmable device comprises an array of individually controllable mirrors.

29. The method according to clause 28, further comprising adjusting an offset value applied to at least one of the individually controllable mirrors with reference to the calculated value of the second parameter.

30. The method according to any of clauses 17 to 29, wherein controlling the lithographic apparatus with reference to the calculated value of the second parameter comprises using the calculated value to determine a setting of one or more selected from:

a position of a mirror in a programmable mirror array used to define the illumination mode;

a setting of a zoom-axicon device;

a setting of a dose control device, such as a device that controls dose as a function of position along an illumination slit;

a setting of a radiation source, such as an intensity of a laser, a pulse repetition rate, a bandwidth, or a polarization state;

a setting of a projection system, such as an aberration control, a programmable phase control device or a lens heating control; and a setting of a support of the patterning device or the substrate, such as a position, velocity or acceleration set point.

31. A lithographic apparatus arranged to image a pattern comprising a plurality of features onto a substrate, the lithographic apparatus comprising:

a support for a patterning device;

a controllable illumination system arranged to illuminate the patterning device;

a projection system arranged to project an image of the patterning device onto the substrate; and a control system arranged to:

set the illumination system to effect a selected illumination mode;

measure a value of a first parameter of the apparatus;

calculate a value of a second parameter of a projected image of a feature of a test pattern comprising a plurality of features using a model of the lithographic apparatus and the measured value of the first parameter; and control the lithographic apparatus with reference to the calculated value of the second parameter.

32. The apparatus according to clause 31, wherein the second parameter is one or more selected from the group consisting of: critical dimension; critical dimension uniformity; and critical dimension through pitch.

33. The apparatus according to clause 31 or clause 32, wherein the first parameter is one or more selected from the group consisting of: intensity at one or more positions in a pupil plane of the illumination system; bandwidth of the radiation; apodization of the projection system; and polarization of the radiation.

34. The apparatus according to any of clauses 31 to 33, wherein the control system is arranged to calculate a value of the second parameter by calculating values of the second parameter for a respective one of the plurality of features of the test pattern, the plurality of features including features that are different in pitch, or orientation, or both pitch and orientation.

35. The apparatus according to any of clauses 31 to 34, wherein the control of the lithographic apparatus affects the first parameter.

36. The apparatus according to any of clause 31 to 35, wherein the model is one or more selected from the group consisting of: an aerial image model and a resist model.

37. The apparatus according to any of clauses 31 to 36, wherein the control system is further arranged to:

perform an exposure of the test pattern onto a substrate;

measure a value of the second parameter in a pattern formed on the substrate; and compare the calculated value of the second parameter and the measured value of the second parameter.

38. The apparatus according to clause 37, wherein the control system is further arranged to adjust the model of the lithographic apparatus with reference to the comparison between the calculated value of the second parameter and the measured value of the second parameter.

39. The apparatus according to clause 37 or clause 38, wherein the control system is further arranged to control a scatterometer to measure the value of the second parameter.

40. The apparatus according to any of clauses 31 to 39, wherein the illumination mode defines intensity distribution across directions of illumination of the patterning device.

41. The apparatus according to clause 40, wherein the illumination system comprises a programmable device arranged to direct radiation into a plurality of directions of illumination of the patterning device.

42. The apparatus according to clause 41, wherein the programmable device comprises an array of individually controllable mirrors.

43. The apparatus according to clause 42, wherein the control system is further arranged to adjust an offset value applied to at least one of the individually controllable mirrors with reference to the calculated value of the second parameter.

44. The apparatus according to any of clauses 31 to 43, wherein the control system is further arranged to determine a setting of one or more selected from:

a position of a mirror in a programmable mirror array used to define the illumination mode;

a setting of a zoom-axicon device;

a setting of a dose control device, such as a device that controls dose as a function of position along an illumination slit;

a setting of a radiation source, such as an intensity of a laser, a pulse repetition rate, a bandwidth, or a polarization state;

a setting of a projection system, such as an aberration control, a programmable phase control device or a lens heating control; and a setting of a support of the patterning device or the substrate, such as a position, velocity or acceleration set point.

45. A computer program product comprising a computer-readable storage medium having stored thereon instructions for performing a method of controlling a lithographic apparatus, the lithographic apparatus having a programmable illumination system arranged to illuminate a patterning device with radiation and a projection system arranged to project an image of the patterning device onto the substrate, the method comprising:

setting the illumination system to effect a selected illumination mode;

measuring a value of a first parameter of the apparatus;

calculating a value of a second parameter of a projected image of a feature of a test pattern comprising a plurality of features using a model of the lithographic apparatus and the measured value of the first parameter; and controlling the lithographic apparatus with reference to the calculated value of the second parameter.

46. A method of improving a mathematical model of a lithographic process, the method comprising:

applying a setting of a first parameter to a lithographic apparatus;

measuring a value of the first parameter as adopted by the lithographic apparatus;

using the mathematical model to obtain a predicted value of a second parameter of an image of a pattern as it would be exposed on a substrate with reference to the measured value of the first parameter;

using the lithographic apparatus to expose the pattern on a substrate;

using a metrology tool to obtain a measured value of the second parameter of the pattern exposed on the substrate; and adapting the mathematical model with reference to the measured value of the second parameter and the predicted value of the second parameter.

47. The method according to clause 46, wherein the first parameter is one or more selected from the group consisting of: intensity at one or more positions in a pupil plane of the illumination system; bandwidth of the radiation; apodization of the projection system; and polarization of the radiation.

48. The method according to clause 46 or clause 47, wherein the second parameter is one or more selected from the group consisting of: critical dimension; critical dimension uniformity; and critical dimension through pitch.

49. The method according to any of clauses 46 to 48, wherein the metrology tool is a scatterometer.

The descriptions above are intended to be illustrative, not limiting. Thus, it will be apparent to one skilled in the art that modifications may be made to the invention as described without departing from the scope of the claims set out below.

The invention claimed is:

1. A method of controlling a lithographic projection apparatus, the method comprising:
    measuring a value of a first parameter of the lithographic projection apparatus when set to effect a selected illumination mode;
    calculating a value of a second parameter of a projected image of a feature of a pattern using a model of the lithographic projection apparatus and the measured value of the first parameter, wherein the model comprises a simulation model of illumination of a patterning device, patterning of the illumination by the patterning device and projecting of the patterned illumination;
    controlling the lithographic projection apparatus based on the measured first parameter by changing a control setting of the lithographic apparatus; and
    further controlling the lithographic projection apparatus with reference to the calculated value of the second parameter by further changing the control setting or changing another control setting, of the lithographic projection apparatus.

2. The method according to claim 1, wherein the second parameter is one or more selected from the group consisting of: critical dimension; critical dimension uniformity; and critical dimension through pitch.

3. The method according to claim 1, wherein the first parameter is one or more selected from the group consisting of: intensity at one or more positions in a pupil plane of an illumination system of the lithographic projection apparatus; bandwidth of radiation of the illumination mode; apodization of a projection system of the lithographic projection apparatus; and polarization of radiation of the illumination mode.

4. The method according to claim 1, wherein calculating a value of the second parameter comprises calculating values of the second parameter for respective ones of a plurality of features of the pattern, the plurality of features including features that are different in pitch, or orientation, or both pitch and orientation.

5. The method according to claim 1, wherein changing the control setting affects the first parameter.

6. The method according to claim 1, wherein the model is one or more selected from the group consisting of: an aerial image model and a resist model.

7. The method according to claim 1, further comprising:
    performing an exposure of the pattern onto a substrate;
    measuring a value of the second parameter in a pattern formed on the substrate; and
    comparing the calculated value of the second parameter and the measured value of the second parameter.

8. The method according to claim 7, further comprising adjusting the model of the lithographic apparatus with reference to the comparison between the calculated value of the second parameter and the measured value of the second parameter.

9. The method according to claim 7, wherein measuring the value of the second parameter is performed using a scatterometer.

10. The method according to claim 1, wherein the illumination mode defines an intensity distribution across directions of illumination of the patterning device.

11. The method according to claim 10, wherein the lithographic projection apparatus comprises a programmable device arranged to direct radiation into a plurality of directions of illumination of the patterning device.

12. The method according to claim 11, wherein the programmable device comprises an array of individually controllable mirrors.

13. The method according to claim 12, further comprising adjusting an offset value applied to at least one of the individually controllable mirrors with reference to the calculated value of the second parameter.

14. The method according to claim 1, wherein controlling the lithographic projection apparatus with reference to the calculated value of the second parameter comprises using the calculated value to determine a setting of one or more selected from the following:
    a position of a mirror in a programmable mirror array used to define the illumination mode;
    a setting of a zoom-axicon device;
    a setting of a dose control device;
    a setting of a radiation source;
    a setting of a projection system; and
    a setting of a support of the patterning device or of a radiation-sensitive substrate.

15. The method according to claim 1, wherein the method is performed prior to use of the lithographic projection apparatus for production of devices.

16. The method according to claim 1, wherein the method is performed periodically.

17. A device manufacturing method using a lithographic projection apparatus, the method comprising:
    measuring a value of a first parameter of the lithographic projection apparatus when set to effect a selected illumination mode;
    calculating a value of a second parameter of a projected image of a feature of a test pattern, separate from a product pattern, using a model of the lithographic projection apparatus and the measured value of the first parameter, wherein the model comprises a simulation model of illumination of a patterning device, patterning of the illumination by the patterning device and projecting of the patterned illumination;
    changing a control setting of the lithographic apparatus with reference to the calculated value of the second parameter; and imaging the product pattern onto the substrate using the illumination mode and the changed control setting.

18. A lithographic apparatus arranged to image a pattern comprising a plurality of features onto a substrate, the lithographic apparatus comprising:
- a support for a patterning device;
- a controllable illumination system arranged to illuminate the patterning device;
- a projection system arranged to project an image of the patterning device onto the substrate; and
- a control system arranged to:
  - measure a value of a first parameter of the lithographic projection apparatus when set to effect a selected illumination mode;
  - calculate a value of a second parameter of a projected image of a feature of a pattern using a model of the lithographic apparatus and the measured value of the first parameter, wherein the model comprises a simulation model of the illumination of the patterning device, the patterning of the illumination by the patterning device and the projecting of the image of the patterning device;
  - control the lithographic projection apparatus based on the measured first parameter by changing a control setting of the lithographic apparatus; and
  - further control the lithographic projection apparatus with reference to the calculated value of the second parameter by further changing the control setting or changing another control setting, of the lithographic projection apparatus.

19. A computer program product comprising a non-transitory computer-readable storage medium having stored thereon instructions for performing a method of controlling a lithographic projection apparatus, the method comprising:
- measuring a value of a first parameter of the lithographic projection apparatus when set to effect a selected illumination mode;
- calculating a value of a second parameter of a projected image of a feature of a pattern using a model of the lithographic projection apparatus and the measured value of the first parameter, wherein the model comprises a simulation model of illumination of a patterning device, patterning of the illumination by the patterning device and projecting of the patterned illumination;
- controlling the lithographic projection apparatus based on the measured first parameter by changing a control setting of the lithographic apparatus; and
- further controlling the lithographic projection apparatus with reference to the calculated value of the second parameter by further changing the control setting or changing another control setting, of the lithographic projection apparatus.

20. A method of improving a mathematical model of a lithographic process, the method comprising:
- applying a setting of a first parameter to a lithographic apparatus;
- measuring a value of the first parameter as adopted by the lithographic apparatus;
- using the mathematical model to obtain a predicted value of a second parameter of an image of a pattern as it would be exposed on a substrate with reference to the measured value of the first parameter;
- controlling the lithographic apparatus with reference to the predicted value of the second parameter by changing a control setting of the apparatus;
- using the lithographic apparatus with the changed control setting to expose the pattern on a substrate;
- using a metrology tool to obtain a measured value of the second parameter of the pattern exposed on the substrate; and
- adapting the mathematical model with reference to the measured value of the second parameter and the predicted value of the second parameter.

* * * * *